(12) United States Patent
Araki et al.

(10) Patent No.: US 6,681,375 B2
(45) Date of Patent: Jan. 20, 2004

(54) CHECK SYSTEM FOR WIRING STRUCTURE OF PRINTED CIRCUIT BOARD

(76) Inventors: Kenji Araki, c/o Sony Corporation 7-35, Kitashinagawa 6-chome, Shinagawa-ku, Tokyo (JP); Ayao Yokoyama, c/o Sony EMCS Corporation Nagano Tec 5432, O-aza Toyoshina, Toyoshina-cho, Minamiazumi-gun, Nagano (JP)

( * ) Notice: Subject to any disclaimer, the term of this patent is extended or adjusted under 35 U.S.C. 154(b) by 0 days.

(21) Appl. No.: 09/905,451

(22) Filed: Jul. 13, 2001

(65) Prior Publication Data

US 2002/0007260 A1 Jan. 17, 2002

(30) Foreign Application Priority Data

Jul. 13, 2000 (JP) .......................... 2000-213153

(51) Int. Cl.[7] .............................................. G06F 17/50
(52) U.S. Cl. .................................. 716/4; 716/5; 716/15
(58) Field of Search ................................. 716/4, 5, 15

(56) References Cited

U.S. PATENT DOCUMENTS 5,477,460 A * 12/1995 Vakirtzis et al. ............... 716/4
6,418,552 B1 * 7/2002 Osborn ........................ 716/15
2001/0018761 A1   8/2001 Sasaki et al.

OTHER PUBLICATIONS

Patent Abstracts of Japan Publication No. 10–049568 Published Feb. 20, 1998.
Patent Abstracts of Japan Publication No. 10–091663 Published Apr. 10, 1998.
Patent Abstracts of Japan Publication No. 2001–318961, Published Nov. 16, 2001.

* cited by examiner

*Primary Examiner*—Huan Hoang
(74) *Attorney, Agent, or Firm*—Robert J. Depke; Holland & Knight, LLC

(57) ABSTRACT

A check system for a wiring structure of a printed circuit board for easily calculating an electric energy of a high-speed signal wiring on the printed circuit board and warning when the energy owned by the signal wiring is larger than a designated threshold value. The electric energy radiated from the high-speed signal wiring intended for checking is calculated by using a simple mathematical expression, and a display to identify the signal wiring is outputted when the electric energy owned by the signal wiring is larger than a certain designated threshold value, and also an instructing message to relocate in an internal layer of the circuit board is outputted against the signal wiring.

8 Claims, 7 Drawing Sheets

$\varepsilon_{reff}$ EFFECTIVE DIELECTRIC CONSTANT

CHECK SYSTEM FOR WIRING STRUCTURE OF PRINTED CIRCUIT BOARD

RELATED APPLICATION DATA

The present application claims priority to Japanese Application No. P2000-213153 filed Jul. 23, 2000, which application is incorporated by reference to the extent permitted by law.

BACKGROUND OF THE INVENTION

1. Field of the Invention

The present invention relates to a check system for a wiring structure of a printed circuit board, and particularly relates to the check system for the wiring structure of the printed circuit board for deciding a wiring layer on which a signal wiring is disposed according to an amount of an electric energy owned by the signal wiring connecting high-speed operating ICs on the circuit board.

2. Description of the Related Art

Conventionally, in the printed circuit board used for recent electronic equipments, a signal of a general digital electronic device includes pulse waves, and it is well known that the electric energy can be calculated based on a rising time and a voltage of the pulse wave.

In this case, a transmission mode of a surface layer wiring is mainly a micro-strip structure. In the case of the micro-strip structure, in addition to a small propagation delay by a dielectric material, a distributed capacity between the wiring and ground planes (image planes) nearest to the wiring is small, so that there is an advantage that the propagation is conducted at higher speed than a strip wiring (hereinafter referred to as a wiring structure, a generic name for a single strip wiring and a double strip wiring). However, on the occasion that a conductor, for example, a shield plate is made approached to the upper part of the micro-strip line, it is ascertained that characteristic impedance in wiring becomes extremely small and waveform is greatly distorted or dulled.

Furthermore, in the case of the strip structure, a leakage of the electric energy (RF (Radio Frequency) energy) radiated from the wiring to the outside is shut out by the upper and the lower ground (or electric power source) planes, but in the case of the micro-strip structure, the plane exists only on the one side, so that it is known that the electric energy is easily radiated to the outside of the circuit board.

However, in a circuit where a signal with the small electric energy (a low-speed digital signal, or a low voltage digital signal) is a mainstream, a radiation to the outside has not remarkably occurred so much. On the occasion that a multi-layer circuit board is used and also a wiring density is not so high, it has easily been possible to suppress a radiation noise by disposing (by making the strip structure) a signal having the large electric energy in an internal layer of the circuit board.

Incidentally, with a speedup of a circuit mounted on the recent printed circuit board, the number of high-speed signal lines is increased, and with miniaturization and multifunction, the wiring density has become high, so that it has become difficult to dispose all the signal lines having the large electric energy in the internal layer of the circuit board (strip structure). Therefore, there has arisen the need for devising to dispose wiring in the internal layer in order of higher priority by adopting prioritization.

However, there has been a problem that, for a large-scaled circuit with thousands of nets, it is impossible to know easily which signal line has the large electric energy.

SUMMARY OF THE INVENTION

The present invention has been made in view of the problems at the time of designing the aforesaid conventional printed circuit board. Accordingly, one of objects of the present invention is to provide a check system for a wiring structure of a printed circuit board for easily calculating an electric energy of a high-speed signal wiring provided on an electric power source plane intended for checking, and for being capable of warning on the occasion that the energy owned by the signal wiring is larger than a designated threshold value.

The present invention to solve the aforesaid problems provides a check system for a wiring structure of a printed circuit board for checking the wiring structure of wiring tentatively designed on the printed circuit board, and it is characterized to include; means for deciding object to extract in order a combination of a driver and a receiver out of a group of parts existing on the above wiring, and after extracting a circuit information of the driver corresponding to one of the above combination, to decide if high-speed signal wiring whose voltage level exceeds a designated threshold value exists or not, according to evaluating result of a plurality of determination expressions including at least a part of the circuit information in valuables; means for outputting a first countermeasure instructing message on the occasion that the above high-speed signal wiring is a micro-strip wiring disposed in the neighborhood of the driver; means for outputting a second countermeasure instructing message on the occasion that the above high-speed signal wiring is the micro-strip wiring disposed in the neighborhood of the receiver; and means for outputting a third countermeasure instructing message on the occasion that the above high-speed signal wiring is the micro-strip wiring disposed at a midpoint between the driver and the receiver.

Namely, the check system for the wiring structure according to the present invention is constituted to calculate by using a simple mathematical expression the electric energy of the high-speed signal wiring on the printed circuit board intended for checking, and to output a display for identifying the signal wiring on the occasion that the electric energy which the signal wiring has is larger than a certain designated threshold value, and also to output the instructing message against the signal wiring to relocate within the internal layer of the circuit board, so that it is made possible to greatly suppress radiation noises radiated from the signal wiring having the large energy without changing a conventional designing process and increasing a designing cost.

Furthermore, by being relocated within the internal layer (strip structure) of the circuit board, the signal wiring having the above large electric energy has no change in its characteristic impedance even when a conductor of a shield plate shape approaches. As a result, such phenomenon as a signal waveform running through the signal wiring is greatly distorted is prevented.

Other and further objects, features and advantages of the present invention will appear more fully from the following description.

DESCRIPTION OF THE PREFERRED EMBODIMENTS

Figure 1:
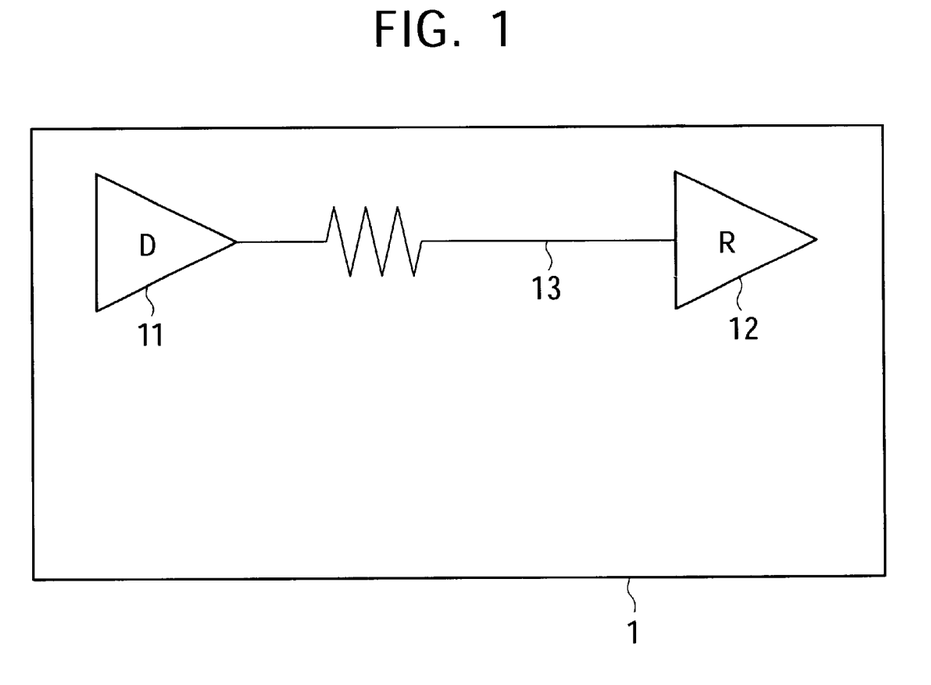
FIG. 1 is a wiring diagram showing a relationship between a ground (electric power source) plane layer and a high-speed signal line on a wiring circuit board intended for checking of a check system for wiring structure of a printed circuit board referring to embodiments of the present invention.

Hereunder, by referring to the following drawings, embodiments of the present invention are described in detail. FIG. 1 is a wiring diagram showing a relationship between a ground (electric power source) plane layer and a high-speed signal line on a wiring circuit board intended for checking of a check system for a wiring structure of a printed circuit board referring to embodiments of the present invention.

The wiring diagram shown in FIG. 1 includes the ground (electric power source) plane 1, a driver 11 installed on the above plane 1, a receiver 12, and a high-speed signal line 13 connecting the driver 11 and the receiver 12.

Figure 2:
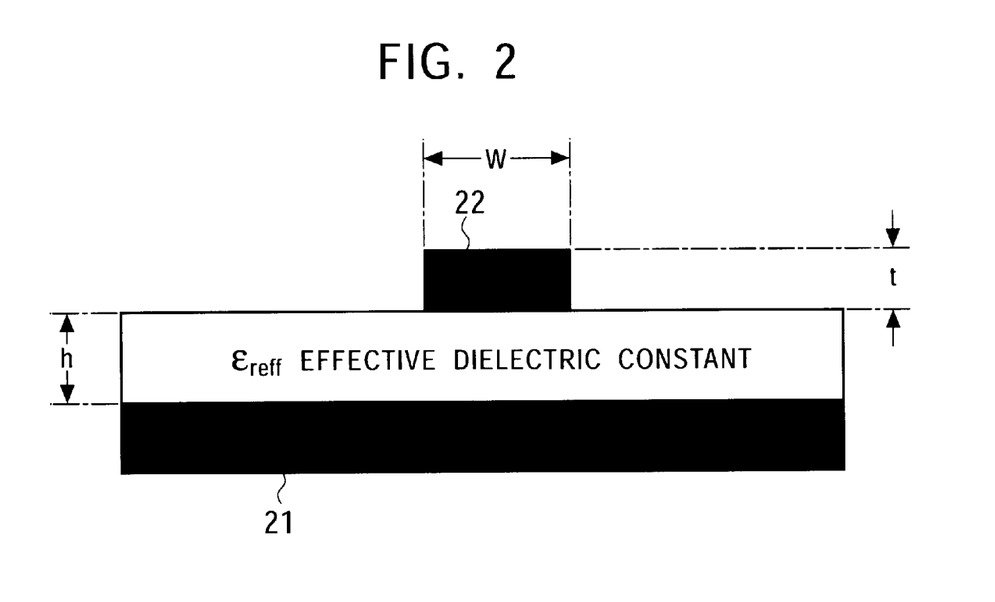
FIG. 2 is a wiring structure diagram showing the wiring structure intended for checking of the check system for the wiring structure of the printed circuit board referring to the embodiments of the present invention.
Figure 3:
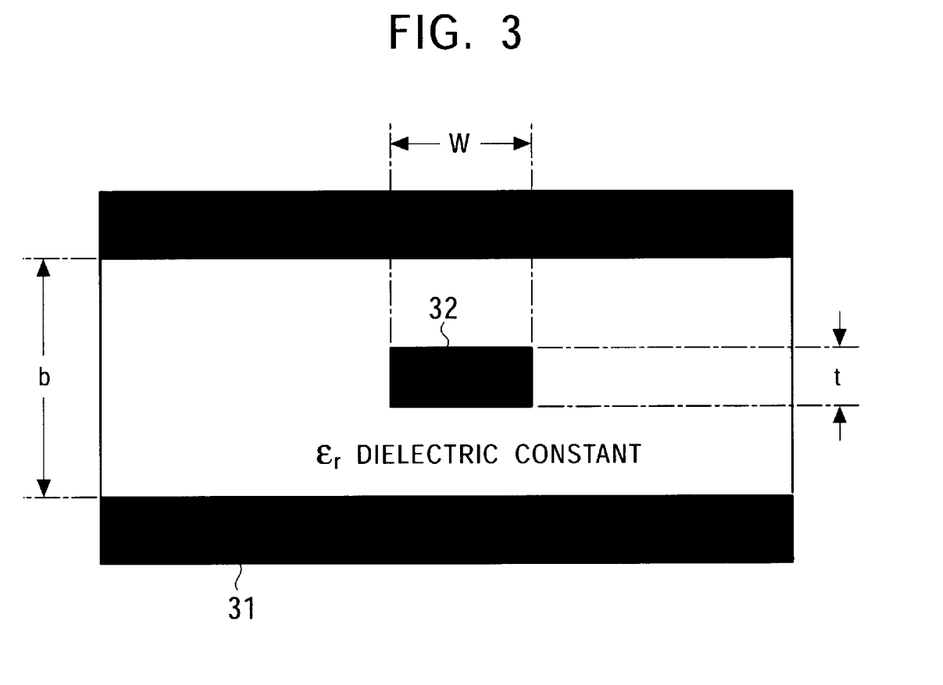
FIG. 3 is a wiring structure diagram showing another wiring structure intended for checking of the check system for the wiring structure of the printed circuit board referring to the embodiments of the present invention.
Figure 4:
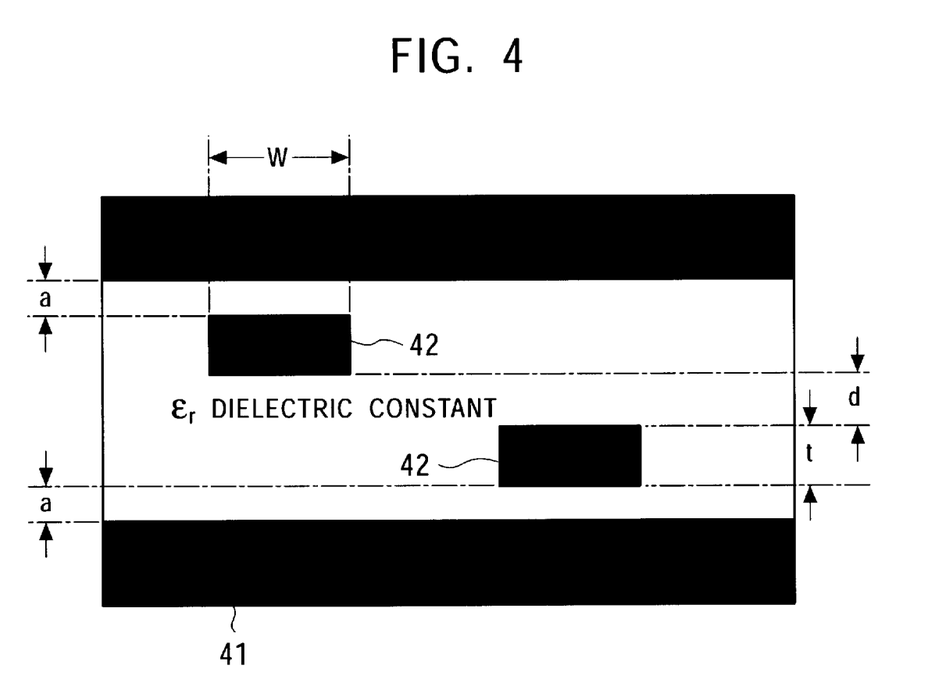
FIG. 4 is a wiring structure diagram showing still another wiring structure intended for checking of the check system for the wiring structure of the printed circuit board referring to the embodiments of the present invention.

FIG. 2 to FIG. 4 are wiring structure diagrams showing wiring structures intended for checking of the check system for the wiring structure of the printed circuit board referring to the embodiments of the present invention. FIG. 2 shows a wiring structure such as called a micro-strip line, FIG. 3 shows a wiring structure such as called a single strip line, and FIG. 4 shows a wiring structure such as called a double strip line.

The wiring structure shown in FIG. 2 includes a ground (electric power source) plane layer 21 and a signal line 22 on the ground (electric power source) plane layer 21. The wiring structure shown in FIG. 3 includes a ground (electric power source) plane layer 31 and a signal line 32 between the ground (electric power source) plane layer 31. The wiring structure shown in FIG. 4 includes a ground (electric power source) plane layer 41 and two routes of a signal line 42 between the ground (electric power source) plane layer 41.

Incidentally, FIG. 2 to FIG. 4 show wiring structures on the general wiring circuit board. The high-speed signal wiring shown in FIG. 1 is also to be included in the category of the wiring shown in FIG. 2 to FIG. 4. In the wiring structures shown in FIG. 2 to FIG. 4, a length shown by a symbol w indicates a wiring width ($\mu$m) of the wiring; a length shown by a symbol t indicates a wiring thickness of the wiring; a length shown by a symbol h indicates a distance ($\mu$m) between the wiring in the micro-strip line structure and the plane layer; a length shown by a symbol b indicates a distance ($\mu$m) between the plane layer in the single strip line structure; a length shown by a symbol a indicates a distance ($\mu$m) between the wiring in the double strip line structure and the plane layer nearest to the above wiring; a length shown by a symbol d indicates a distance ($\mu$m) between wiring of a 2-route wiring in the double strip line structure; a symbol $\in_r$ indicates a dielectric constant between the ground (electric power source) plane layer 31 in the single strip line structure and between the ground (electric power source) plane layer 41 in the double strip line structure; and a symbol $\in_{reff}$ indicates an effective dielectric constant between the ground (electric power source) plane layer 21 in the micro-strip line structure 21 and the signal line 22.

Hereunder, there is described a function of the check system for the wiring structure of the printed circuit board referring to the present invention. However, with regard to the configuration of the check system for the wiring structure of the printed circuit board referring to the present invention, it can be put into practice by a well-known computer system, so that illustration is omitted.

The check system for the wiring structure of the printed circuit board referring to the present invention calculates by a simple mathematical expression the electric energy which the high-speed signal wiring has, against tentatively designed high-speed signal wiring existing on the ground (electric power source) plane intended for checking, and confirms whether the calculated electric energy is larger than a threshold value of the designated electric energy which is set up beforehand in the high-speed signal wiring, and instructs to output an error message when the calculated electric energy is larger than the above threshold value, whereby a design for greatly suppressing a radiation noise discharged from the high-speed signal wiring with the large energy is made possible.

Figure 5:
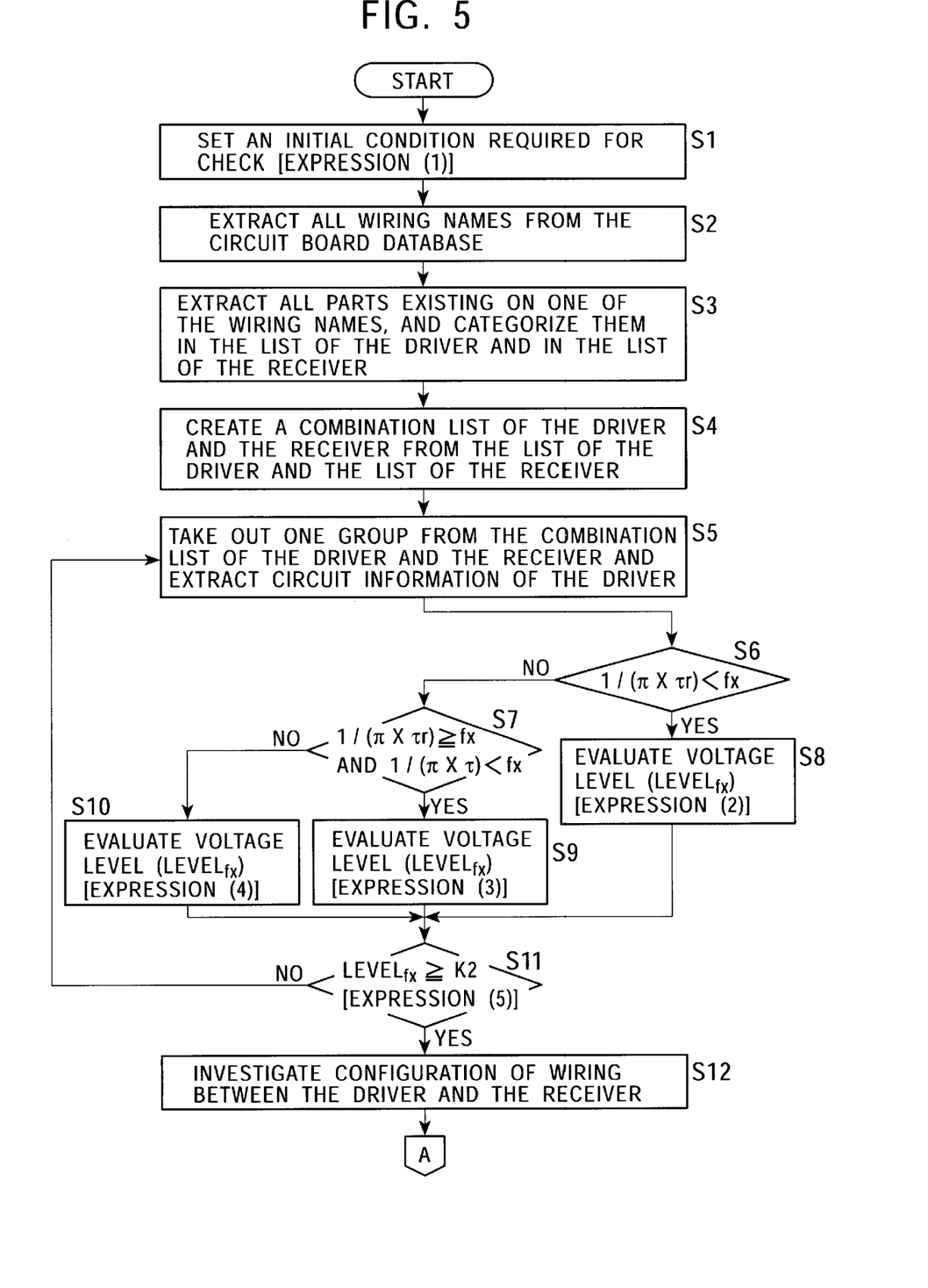
FIG. 5 is a flowchart (the first half) showing an operation of the check system for the wiring structure of the printed circuit board referring to the embodiments of the present invention.
Figure 6:
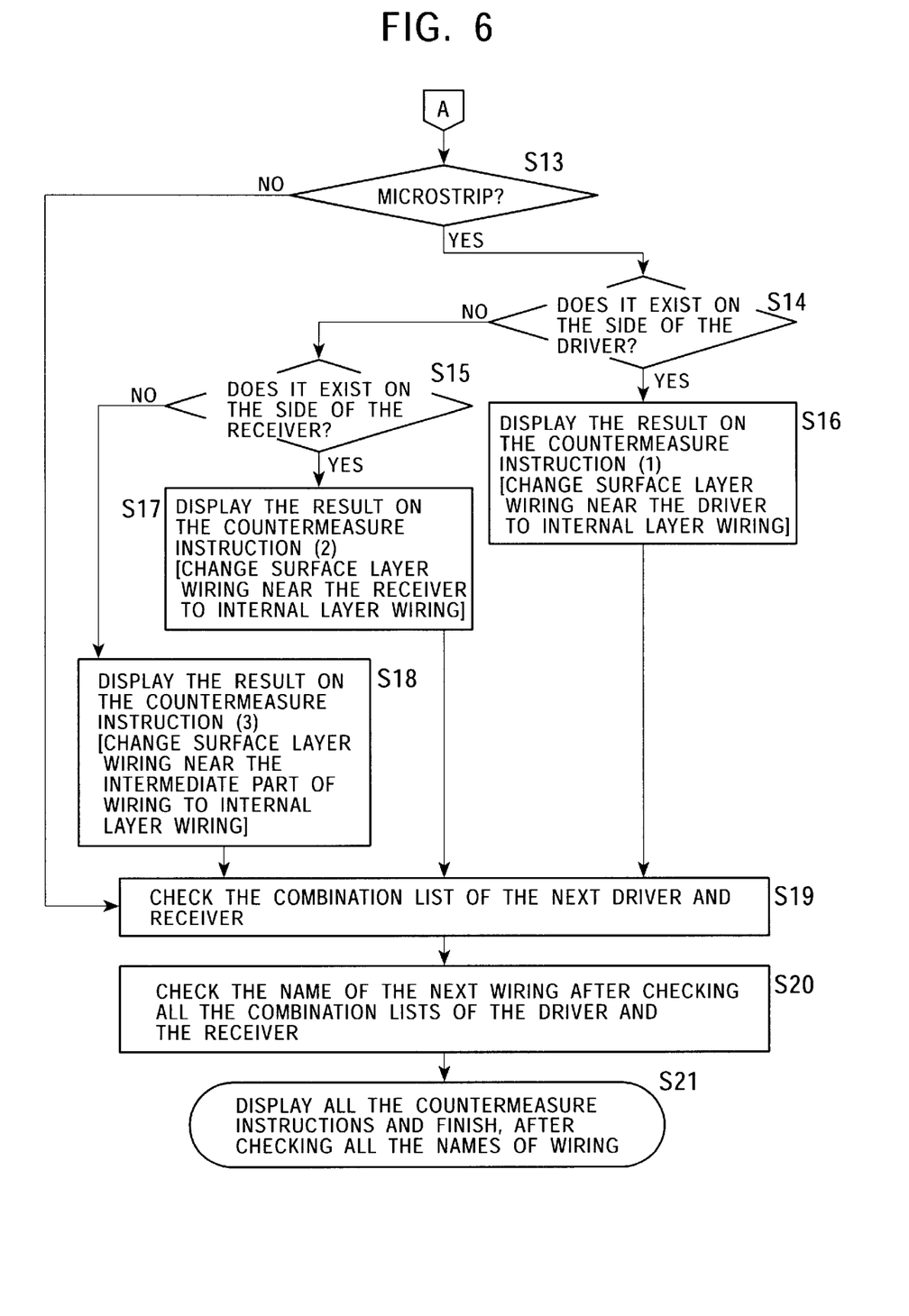
FIG. 6 is a flowchart (the latter half) showing the operation of the check system for the wiring structure of the printed circuit board referring to the embodiments of the present invention.

FIG. 5 and FIG. 6 are flowcharts showing operations of the check system for the wiring structure of the printed circuit board referring to the embodiments of the present invention.

Hereunder, by referring to FIG. 1 to FIG. 4, there is described operation of the check system for the wiring structure of the printed circuit board referring to the embodiments of the present invention by using the flowcharts shown in FIG. 5 and FIG. 6.

Hereunder, suppose an amplitude of a pulse current flowing through the above high-speed signal wiring between the above driver and receiver is a symbol A; a pulse width of the current (Sec.) is a symbol τ; pulse raise time (Sec.) is a symbol τr; the maximum applicable frequency (MHz) of current flowing through the above signal wiring is a symbol fx; a voltage level in the maximum applicable frequency (MHz) fx of current flowing through the above signal wiring is Level$_{fx}$; and symbols K1, K2 are given coefficients. However, the flowcharts shown in FIG. 5, FIG. 6, and expressions of (1) to (5) used in the following description are described later altogether.

Firstly, step S1 sets an initial condition required for check by conducting assignment of an expression (1).

Step S2 extracts all wiring names from a circuit board database (not shown) which stores circuit board information.

Step S3 extracts all parts existing on one of the wiring names, and categorizes them in the list of the driver and in the list of the receiver.

Step S4 creates a combination list of the driver and the receiver from the above lists of the driver and the receiver.

Step S5 takes out one group from the above created combination list of the driver and the receiver, and extracts circuit information of the driver in the above group.

Step S6 evaluates $1/(\pi \times \tau r) < fx$ as a conditional expression and if the conditional expression is satisfied, evaluates a Level$_{fx}$ by an expression (2) described later in step S8, and if the conditional expression is not satisfied, proceeds to step S7.

Step S7 evaluates $1/(\pi \times \tau r) \geq fx$ and $1/(\pi \times \tau) < fx$ as the conditional expressions, and if the conditional expressions are satisfied, evaluates the Level$_{fx}$ by an expression (3) described later in step S9, and if the conditional expressions are not satisfied, evaluates the Level$_{fx}$ by an expression (4) described later in step S10, then proceeds to step S11.

Step S11, when a reference level of voltage of a current flowing through the above high-speed signal wiring between the above driver and the receiver is supposed to be K2, evaluates Level$_{fx} \geq$ K2 (namely, an expression (5)) as a conditional expression including a constant K2, and if the conditional expression is not satisfied, returns to the above step S5, and if the conditional expression is satisfied, proceeds to step S12.

Step S12 investigates a configuration of the wiring between the above driver and the receiver, and confirms a location where a surface layer wiring, namely, the micro-strip wiring exists.

Step S13 verifies if a wiring structure is the micro-strip line or not, and if it is not the micro-strip line, moves to step 19 described later, and if it is the micro-strip line, moves to step S14.

Step S14 verifies if the above surface layer wiring exists on the side of the driver or not, and if it exists on the side of the driver, moves to step S16 described later, and if it does not exists on the side of the driver, moves to step S15.

Step S15 verifies if the above surface layer wiring exists on the side of the receiver or not, and if it exists on the side of the receiver, moves to step S17 described later, and if it does not exists on the side of the receiver, moves to step S18 as described later.

Step S16 moves to step S19 described later after displaying the above check result on a countermeasure instruction (1) and outputting. As the countermeasure instruction (1), it is possible to include a message, for example, [change surface layer wiring near the driver to internal layer wiring].

Step S17 moves to step S19 described later after displaying the above check result on a countermeasure instruction (2) and outputting. As the countermeasure instruction (2), it is possible to include a message, for example, [change surface layer wiring near the receiver to internal layer wiring].

Step S18 moves to step S19 described later after displaying the above check result on a countermeasure instruction (3) and outputting. As the countermeasure instruction (3), it is possible to include a message, for example, [change surface layer wiring near the intermediate part of wiring to internal layer wiring].

Step S19 checks a combination list of the next driver and receiver.

Step S20, after checking all the combination lists of the driver and the receiver, checks the name of the next wiring.

Step S21, after checking all the names of the wiring, displays all the countermeasure instructions displayed and outputted and finishes checking.

Figure 7:
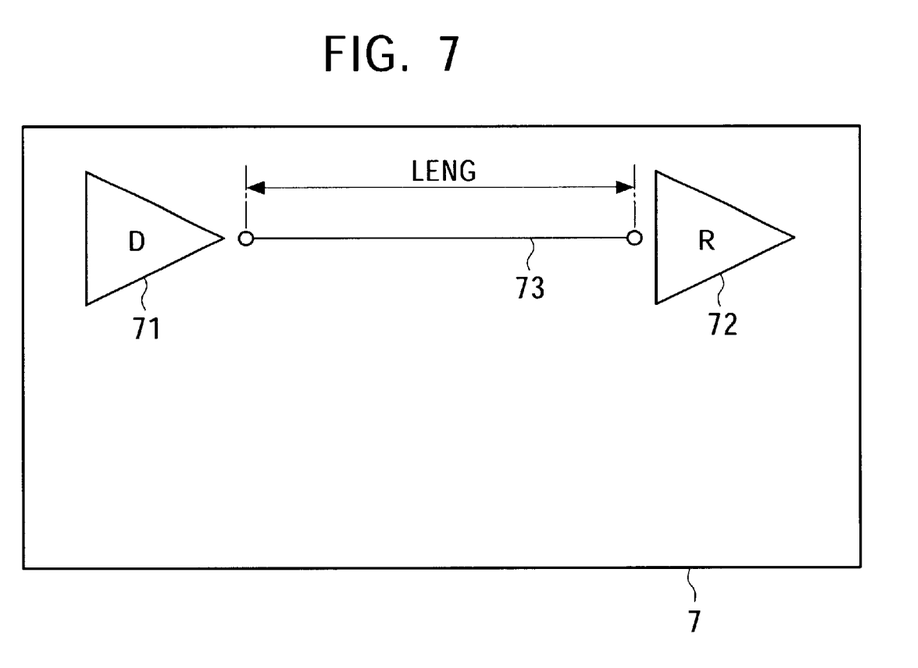
FIG. 7 is a wiring diagram showing one example of wiring on the wiring circuit board intended for checking of the check system for the wiring structure of the printed circuit board referring to the embodiments of the present invention.

FIG. 7 is a wiring diagram showing one example of a wiring on the wiring circuit board intended for checking of the check system for the wiring structure of the printed circuit board referring to the embodiments of the present invention.

Wiring on the wiring circuit board (circuit board wiring) shown in FIG. 7 is provided with a ground (electric power source) plane 7, a driver 71 and a receiver 72 on the above ground (electric power source) plane 7 and a high-speed signal wiring 73 for connecting the driver 71 and the receiver 72.

The specification of the above circuit board wiring shall be as follows:

Namely, a signal wiring name is E1; a total wiring length is 100.0 (mm); a driver (D) is IC100, 1pin; a receiver (R) is IC200, 1pin, an operating frequency is 50.0 (MHz), a pulse width (τ) is 10.0 (ns), raise time (τr) is 1.0 (ns), and an amplitude (A) is 3.3 (V).

Figure 8:
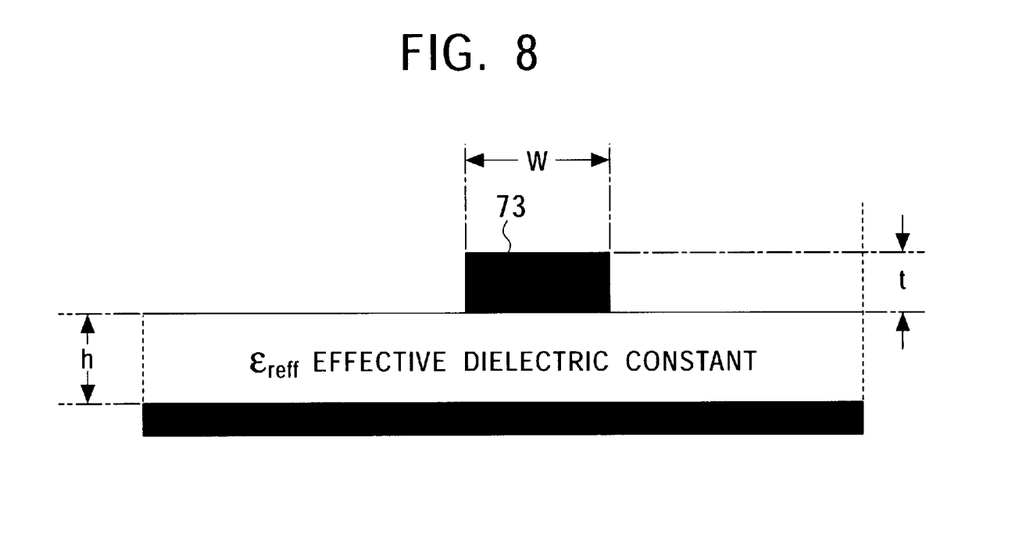
FIG. 8 is a wiring structure diagram showing one example of the wiring structure on the wiring circuit board intended for checking of the check system for the wiring structure of the printed circuit board referring to the embodiments of the present invention.

FIG. 8 is a wiring structure diagram showing one example of wiring structure on the wiring circuit board intended for checking of the check system for the wiring structure of the printed circuit board referring to the embodiments of the present invention.

The specification of the wiring structure on the wiring circuit board shown in FIG. 8 shall be as follows:

Namely, a type of the wiring structure is the micro-strip line; a wiring width is 0.16 (mm)=160 (μm); a wiring thickness (t) is 0.04 (mm)=40 (μm); a wiring height (h) is 0.10 (mm)=100 (μm); and an effective dielectric constant ($\in_{reff}$) is 4.3.

Figure 9:
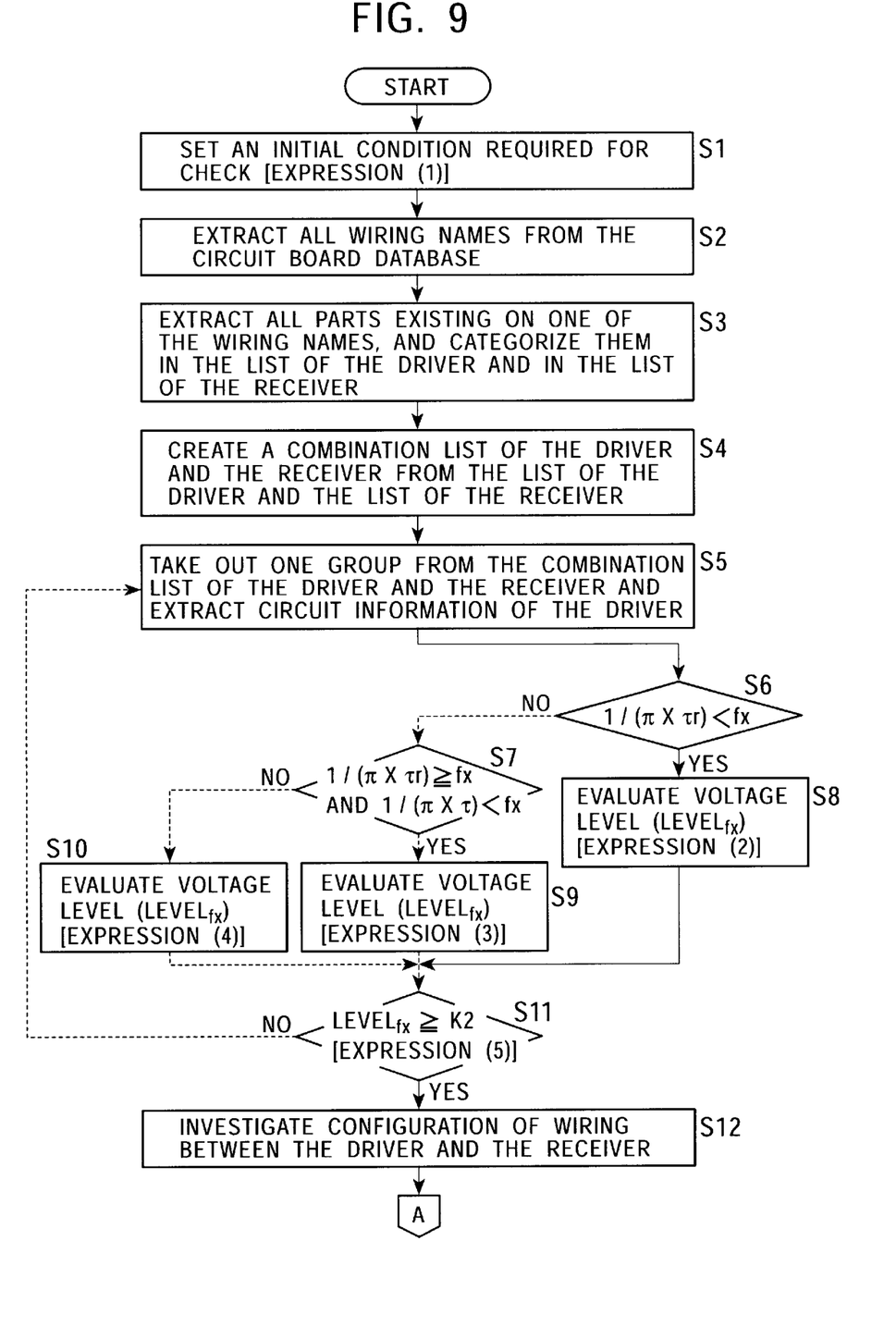
FIG. 9 is a flowchart (the first half) showing a process executed by the check system for the wiring structure of the printed circuit board referring to the embodiments of the present invention against the printed circuit board which is provided with the circuit board wiring shown in FIG. 7 and the wiring structure shown in FIG. 8.
Figure 10:
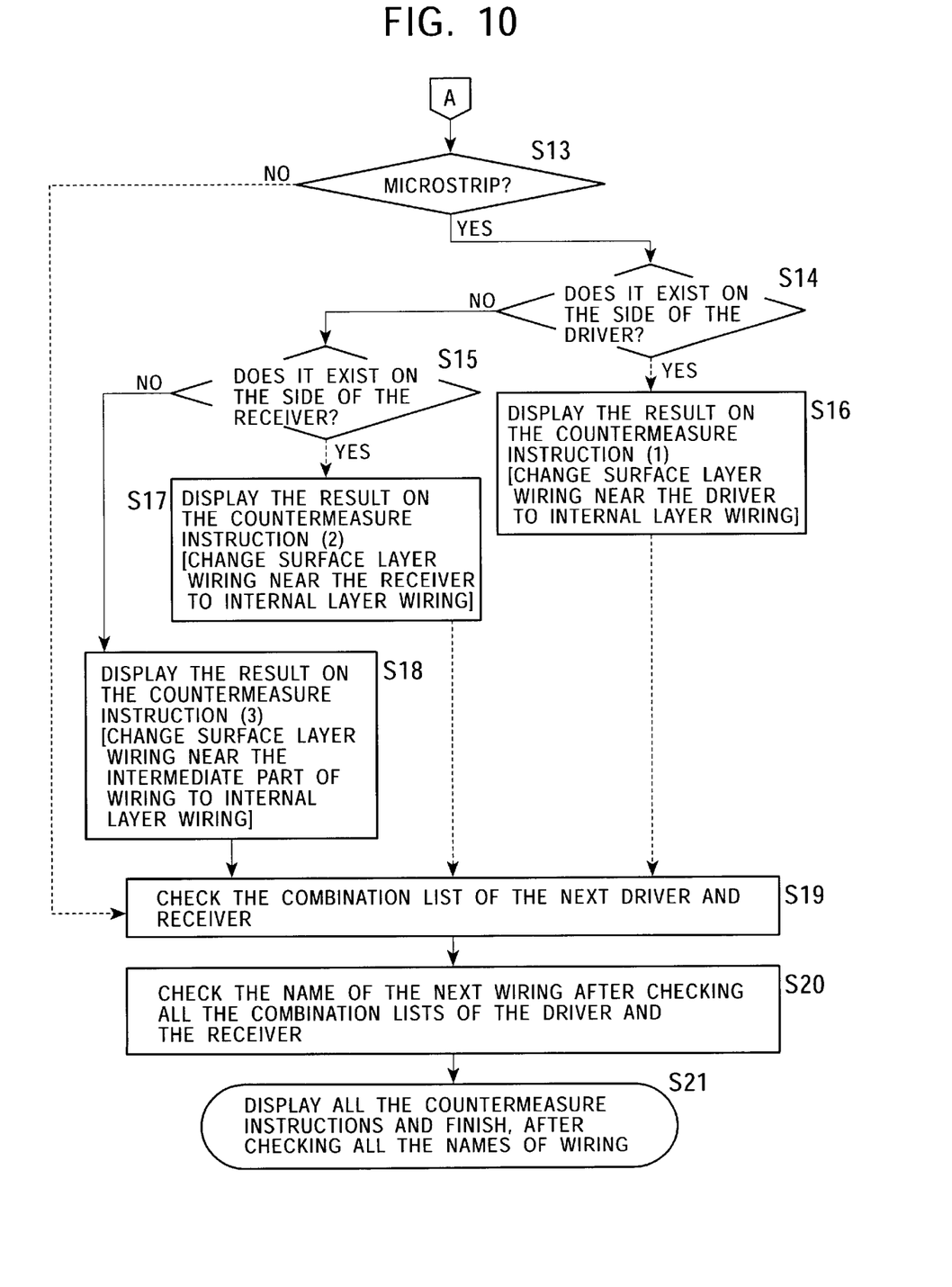
FIG. 10 is a flowchart (the latter half) showing the process executed by the check system for the wiring structure of the printed circuit board referring to the embodiments of the present invention against the printed circuit board which is provided with the circuit board wiring shown in FIG. 7 and the wiring structure shown in FIG. 8.

FIG. 9 and FIG. 10 are flowcharts showing processes being executed by the check system for the wiring structure of the printed circuit board referring to the embodiments of the present invention against the printed circuit board, which is provided with the circuit board wiring shown in FIG. 7 and the wiring structure shown in FIG. 8.

In the flowcharts shown in FIG. 9 and FIG. 10, a route written with a thick solid line shows a process route actually executed at the time of the above execution, and a route written with a broken line shows a process route which is not executed at the time of the above execution.

Herein, there is shown that processing is executed in the routes of step S1 to S6, S8, S11 to S15, S18 and S19 to S21, and other processing is not executed. Hereunder, the above process is described by tracing processing actually executed.

However, setting herein is made that a constant K1=1200, namely, a given maximum applicable frequency fx=1200

(MHz), and a constant K2=72.0, namely, a given reference level is 72.0 (dBμV).

Firstly, step S1 sets the maximum applicable frequency fx=1200 (MHz), the reference level=72.0 (dBμV) in the expression (1) as an initial condition.

Step S2 extracts the wiring name E1 of the circuit board wiring shown in FIG. 7 and FIG. 8.

Steps S3 and S4 create a combination list (IC100, IC200) from a list of the driver (IC100) and a list of the receiver (IC200).

Steps S5 to S8 extract τ, τr, A from the combination list of the above driver and the receiver, and calculates Level$_{fx}$=87.3 (dBμV) by using the expression (2).

Step S11 compares the above Level$_{fx}$=87.3 (dBμV) with the above reference level, namely, 72.0 (dBμV).

Step S12 investigates a wiring configuration of the circuit board wiring having the above wiring name EI, and confirms the existing position of the surface layer wiring.

Step S13, as the result of the above confirmation, confirms that the surface layer wiring, namely, the micro-strip line exists.

Step S14 and S15 confirm by the result of execution of the above step S12 that the above surface layer wiring exists in the intermediate layer of wiring.

Step S18 performs display output of the countermeasure instruction (3) against the above wiring name EI.

Step S19 to S21 confirm that there exist no other wiring names and displays the above countermeasure instruction (3) to finish checking.

Further, when the case of the micro-strip line (surface layer wiring) with the above wiring name EI and the case of the strip wiring (internal layer wiring) are compared and actually measured with regard to a magnetic field close to the wiring, it has been ascertained that there is almost no leakage of the magnetic field in the range of 100 (MHz) to 1 (GHz) in the case of the strip wiring. In other words, by changing the design of the signal wiring with large electric energy to that of the strip structure, a radiating magnetic field (radiation noise) of the signal wiring may be greatly suppressed.

Accordingly, it has become clear that the check system for the wiring structure of the printed circuit board referring to the present invention can be designed to greatly suppress a non-desired electromagnetic wave radiation noise produced in the wiring of the printed circuit board.

(Description Referring to the Mathematical Expression)

Hereunder, there are described mathematical expressions referred to in the above descriptions and the above flowcharts. Firstly, there is the following expression (1) as the mathematical expression referring to step S1.

[Mathematical Expression 1]

$$fx = K1 (MHz) \quad (1)$$

Next, there is the following expression (2) as a conditional expression referring to steps S6 and S8 of the flowcharts shown in FIG. 5 and FIG. 9.

[Mathematical Expression 2]

If $1/(\pi \times \tau r) < fx$, then $$\text{Level}_{fx} = 120 + 20 \log_{10}(A \times \tau r/\tau) - 40 \log_{10}(fx \times \pi \times \tau r) \quad (2)$$

Additionally, there is the following expression (3) as a conditional expression referring to steps S7 and S9 of the flowcharts shown in FIG. 5 and FIG. 9.

[Mathematical Expression 3]

If $1/(\pi \times \tau r) \geq fx$ and $1/(\pi \times \tau) < fx$, then $$\text{Level}_{fx} = 120 + 20 \log_{10}(A/(fx \times \pi \times \tau)) \quad (3)$$

Further, there is the following expression (4) as a conditional expression referring to Steps S7 and S10 of the flowcharts shown in FIG. 5 and FIG. 9.

[Mathematical Expression 4]

If $1/(\pi \times \tau) \geq fx$, then $$\text{Level}_{fx} = 120 + 20 \log_{10} A \quad (4)$$

Finally, there is the following expression (5) as a determination expression referring to Step 11 of the flowcharts shown in FIG. 5 and FIG. 9.

[Mathematical Expression 5]

$$\text{Level}_{fx} \geq K2 \quad (5)$$

Moreover, such programs as to perform processing shown in the flowcharts of FIG. 5 and FIG. 6, according to which the check system for wiring structure of the printed circuit board referring to the embodiments of the present invention performs the above processing, may be stored in a storage medium readable by a computer such as a CD-ROM (Compact Disc Read Only Memory) or a magnetic tape and distributed. A computer, which includes at least a microcomputer, a personal computer, a general purpose computer in its category, may readout and perform the above programs from the above storage medium.

As described above, according to the present invention, electric energy of the high-speed signal wiring on the printed circuit board intended for checking is calculated by using a simple mathematical expression. On the occasion that the electric energy owned by the signal wiring is larger than a certain designated threshold value, a display to identify the signal wiring is outputted, and also an instruction message for providing relocation in the internal layer of the circuit board for the signal wiring is outputted, so that it has become possible to greatly suppress a radiation noise radiated from the signal wiring with large energy, without changing a conventional designing process and without increasing a designing cost.

Further, the above signal wiring having large electric energy, by being relocated in the circuit board internal layer (strip structure), has no change in a characteristic impedance, even when a conductor in a shield plate shape approaches. As a result, a phenomenon such that signal waveform flowing through the signal wiring is greatly distorted (dull) is not produced.

What is claimed is:

1. A printed circuit board wiring analysis system comprising:
    a means for analyzing the electrical energy transmitted through a plurality of signal lines in the printed circuit board and determining whether the electrical energy exceeds a threshold value; and
    means for generating a signal identifying proposed alternate signal routing if the threshold value is exceeded, wherein the proposed alternate signal routing is a different wiring structure.

2. The printed circuit board wiring analysis system according to claim 1, wherein
    the means for analyzing the electrical energy includes means for analyzing one or more of the following:

a pulse width of a pulse voltage signal;

a raise time;

an amplitude;

a maximum applicable frequency; or a voltage level of said pulse voltage signal in said maximum applicable frequency.

3. The printed circuit board wiring analysis system according to claim 1, wherein the means for generating a signal identifying proposed alternate signal routing further includes a means for proposing a change in micro-strip wiring disposed near a driver to an internal layer wiring.

4. The printed circuit board wiring analysis system according to claim 1, wherein the means for generating a signal identifying proposed alternate signal routing further includes a means for proposing a change in micro-strip wiring disposed near a receiver to an internal layer wiring.

5. The printed circuit board wiring analysis system according to claim 1, wherein the means for generating a signal identifying proposed alternate signal routing further includes a means for proposing a change in micro-strip wiring disposed at a midpoint between a driver and a receiver to internal layer wiring.

6. The printed circuit board wiring analysis system according to claim 1, wherein an internal layer wiring is either a single strip wiring or a double strip wiring.

7. A method of analyzing a printed circuit board wiring comprising the steps of:

analyzing the electrical energy that is to be transmitted across a plurality of signal lines;

identifying one or more signal lines which will carry electrical energy exceeding a predetermined threshold value; and generating a signal identifying proposed alternate signal routing, wherein the proposed alternate signal routing is a different wiring structure.

8. The method for analyzing a printed circuit board wiring of claim 7 further comprising the step of further comprising proposing a change in micro-strip wiring to an internal layer wiring.

* * * * *